United States Patent
Zheng et al.

[11] Patent Number: 6,122,219
[45] Date of Patent: Sep. 19, 2000

[54] SPLIT ARRAY SEMICONDUCTOR GRAPHICS MEMORY ARCHITECTURE SUPPORTING MASKABLE BLOCK WRITE OPERATION

[75] Inventors: Hua Zheng; Hui Zhao, both of Fremont, Calif.

[73] Assignee: Winbond Electronics Corporation America, San Jose, Calif.

[21] Appl. No.: 09/115,377

[22] Filed: Jul. 14, 1998

[51] Int. Cl.[7] .............................. G11C 8/00; G11C 16/04
[52] U.S. Cl. ............................... 365/230.06; 365/230.02; 365/189.02
[58] Field of Search ......................... 365/230.06, 230.02, 365/189.02

[56] References Cited

U.S. PATENT DOCUMENTS

| | | | |
|---|---|---|---|
| 5,321,665 | 6/1994 | Balistreri et al. | 365/230.06 |
| 5,579,280 | 11/1996 | Son et al. | 365/230.06 |
| 5,808,959 | 9/1998 | Kengeri et al. | 365/230.06 |

*Primary Examiner*—Trong Phan
*Attorney, Agent, or Firm*—Proskauer Rose LLP

[57] ABSTRACT

A semiconductor memory column decoder has first and second groups of parallel column lines (or column line pairs). The first and second groups of column lines are separated from each other by a gap. One or more groups of fractional I/O lines are provided, wherein each fractional I/O line is collinear with each other fractional I/O line of the same group. One fractional I/O line is provided for, and is connected to, each column line of the first and second groups of column lines. A plurality of multiplexers is provided, including one multiplexer corresponding to each fractional I/O line. Each multiplexer has an input connected to a single data line, a select input connected to a corresponding column select line, and an output connected to the corresponding fractional I/O line. At least some of the multiplexers are disposed in the gap.

6 Claims, 3 Drawing Sheets

SPLIT ARRAY SEMICONDUCTOR GRAPHICS MEMORY ARCHITECTURE SUPPORTING MASKABLE BLOCK WRITE OPERATION

FIELD OF THE INVENTION

The present invention pertains to semiconductor memory integrated circuits (ICs). In particular, the present invention pertains to a layout for a graphics memory IC that supports a maskable block write operation yet minimizes the area occupied by the I/O lines.

BACKGROUND OF THE INVENTION

A semiconductor memory IC, such as a synchronous graphics random access memory (SGRAM), typically includes an array of memory cells organized into rows and columns. Each memory cell can store one bit of data and is accessed by activating a row line of the row of the memory cell and a column line or pair of column lines of the column of the memory cell. Herein, the invention is illustrated assuming that a pair of column lines is connected to each column of memory cells, without loss of generality. A memory cell access can occur in the course of a read or write operation and a row line or column line pair can be activated by applying a particular voltage to the row line or column line pair or by monitoring the voltage thereon. Each memory cell is assigned a unique address which can be divided into a row address, indicating a row line connected to the cell, and a column address, indicating a column line pair connected to the cell.

FIG. 1 shows the column decoder architecture 10 of a conventional RAM. In writing a data value to a particular accessed memory cell, the data value appearing on I/O pad 12 is inputted to a write driver 14. The data value is outputted from the write driver 14 on a pair of data lines 22 to I/O line pairs 16-1, 16-2, . . . , 16-N. The data value is provided to each of N column decoders 18-1, 18-2, . . . , 18-N to which each corresponding I/O line pair 16-1, 16-2, . . . , 16-N is connected. Each column decoder 18-1, 18-2, . . . , 18-N activates one column line pair of a set of (in this case, eight) column line pairs 20-0, 20-1, 20-2, 20-3, 20-4, 20-5, 20-6 or 20-7 which activated column line pair is connected to the particular accessed cell. The particular column line pair 20-0 to 20-7 activated is indicated by part of the column address Y of the to-be-accessed cell. (Another portion of the column address Y of the cell not shown may be used to selectively activate only the particular one of the column decoders 18-1, 18-2, . . . , 18-N connected to the set of column line pairs 20-0 to 20-7 possessing the column line pair of the accessed cell).

The SGRAM column decoder architecture 10 shown in FIG. 1 is advantageous in that a savings is achieved in layout area for the I/O lines 16-1, 16-2 and 16-N. Specifically, (other than the address lines Y) only a single pair of data lines 22 need extend along the top of the memory array.

Desirably, the column decoder architecture 10 supports a block write operation, during which a single data value is stored in multiple memory cells simultaneously. Another signal can be propagated by a line (not shown) for causing a column decoder, e.g., the column decoder 18-1, to activate all column line pairs 20-0 to 20-7 simultaneously during a block write operation, thereby storing the data value transferred via data line pair 22 in a cell of each column.

In a more advanced block write operation, a mask is externally supplied which specifies only selected ones of the columns, of a set of columns, to be written with the data value during the block write. However, the column decoder architecture 10 of FIG. 1 cannot accommodate such a maskable block write operation.

FIG. 2 shows a second conventional column decoder architecture 30 that supports a maskable block write operation. A data value appearing on the I/O pad 32 is driven by the write driver 34 onto a data line 46. The data value on data line 46, and an externally supplied mask signal CMSK, are received at a mask circuit 44. The mask circuit 44 outputs the data value of data line 46 on each pair of I/O lines 36 corresponding to a particular column line, as specified by the mask. For instance, the column line pairs are organized into N sets 41-1, . . . 41-N, of, for example, eight column line pairs per set. The mask has eight bits specifying which of the column line pairs of a set of column line pairs should be written with the data value. The mask circuit 44 outputs a copy of the data value on only those I/O line pairs 36 corresponding to column line pairs of a set indicated by the mask signal CMSK. Each copy of the data value is carried to a respective column decoder 38-1, . . . , 38-N by a corresponding set of I/O line taps 36-1, . . . , 36-N. (The column address Y is also received at the column decoders 38-1, . . . , 38-N for use in an ordinary write or read operation.) In response, the column decoders 38-1, . . . , 38-N activate the column line pairs for which data is provided so as to simultaneously store the data values into each non-masked column.

Multiple pitch column decoders, such as double pitch and quad pitch column decoders are known. Multiple pitch column decoders can save layout spacing in the area allocated to the column decoders. For example, a double pitch column decoder is connected to two sets of column line pairs and has a separate sense amplifier for each set of column line pairs. During an ordinary read or write operation to a single addressed cell, the double pitch column decoder actually selects two column line pairs, namely, one column line pair in each of the two sets to which it is connected. The particular selected column line pair in each set is indicated by a portion of the column address. However, a column select signal activates only one of the two sense amplifiers, thereby only enabling one column line pair to be activated. Likewise, a quad pitch column decoder is a decoder connected to four sets of column line pairs. The quad pitch column decoder selects four column line pairs in response to an ordinary read or write operation, namely, one column line pair in each of the four sets to which it is connected. However, one or more column select signals disable three of the four sense amplifiers of the non-selected sets of column line pairs so that only one column line pair is effectively activated.

The column decoder architecture 30 of FIG. 2 can accommodate the maskable block write operation. The problem, however, is that multiple I/O lines 36 must be provided at the top of the array that run the entire length of the array. Each I/O line requires, for example, 2 $\mu$m of spacing for the width of the line and for separating adjacent lines from each other. The example in FIG. 2 shows only eight I/O line pairs 36 running across the top of the array requiring a total area of 8×2×2 $\mu$m wide×the length of the top of the array.

It is an object of the present invention to decrease the spacing requirement necessary to implement a maskable block write operation in a semiconductor memory IC.

SUMMARY OF THE INVENTION

This and other objects are achieved by the present invention. According to one embodiment, a semiconductor memory column decoder has first and second groups of parallel column lines (or column line pairs). The first and second groups of column lines are separated from each other by a gap. One or more groups of fractional I/O lines are provided, wherein each fractional I/O line is collinear with each other fractional I/O line of the same group. One fractional I/O line is provided for, and is connected to, each column line of the first and second groups of column lines. A plurality of multiplexers is provided, including one multiplexer corresponding to each fractional I/O line. Each multiplexer has an input connected to a single data line, a select input connected to a corresponding column select line, and an output connected to the corresponding fractional I/O line. At least some of the multiplexers are disposed in the gap.

By separating the first and second sets of column lines by the gap, enough space is provided for the multiplexers for selecting centrally located column lines while minimizing space needed for the fractional I/O lines. As a result, less space need be allocated at the top of the array for fractional I/O lines.

DETAILED DESCRIPTION OF THE INVENTION

Figure 3:
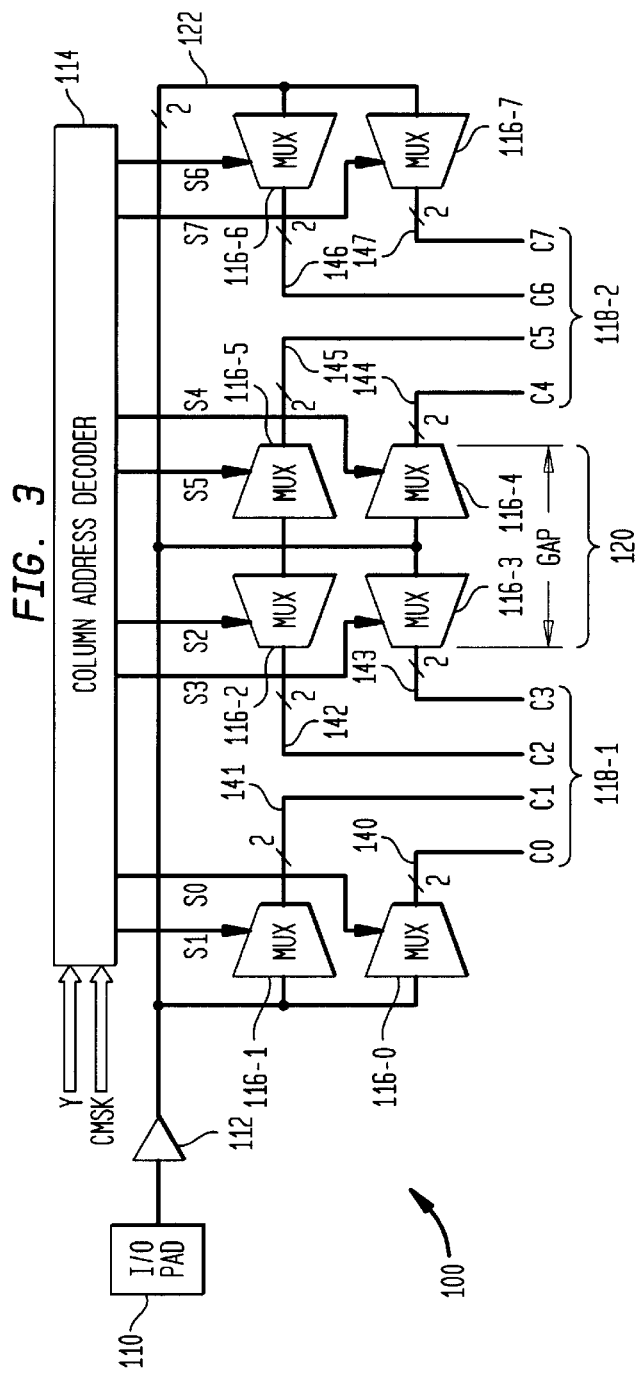
FIG. 3 shows a column decoder architecture according to an embodiment of the present invention.

FIG. 3 shows a column decoder architecture 100 according to an embodiment of the present invention. A data value received on pad 110 is outputted to a write driver 112, which outputs the data value signal on a single pair of I/O lines 122. A column address Y is received at a column address decoder 114 of the column decoder 100. A mask signal CMSK is also received at the column address decoder 114. During a normal read or write operation, the column address decoder 114 outputs an enabling signal on a single enable signal line s0, s1, s2, s3, s4, s5, s6 or s7 which corresponds to a particular pair of column lines c0, c1, c2, c3, c4, c5, c6 or c7, respectively, addressed by the column address signal Y. This activates the particular addressed column line pair c0, c1, c2, c3, c4, c5, c6 or c7. As before, the column line pairs c0–c7 are pair-wise mutually parallel and are connected to respective columns of memory cells.

During a block write operation, a mask signal CMSK is provided which specifies certain column line pairs, of each selected set of column line pairs, on which a data value is to be written and each other column line pair, of the selected sets of column line pairs, masked-out, i.e., on which the data value is not written. In response, the column address decoder 114 simultaneously outputs an enabling signal on each select line s0–s7 corresponding to each column c0–c7 indicated by the signal CMSK. This simultaneously activates each of the selected columns of the set c0–c7, as described below.

The column line pairs of the set c0–c7 are divided into two groups 118-1 and 118-2 wherein the group 118-1 comprises column line pairs c0–c3 and the group 118-2 comprises the column line pairs c4–c7. The groups of column line pairs are separated by a gap 120. The purpose of the gap 120 is to provide lateral space for the multiplexers 116-2, 116-3, 116-4 and 116-5.

Multiple multiplexers 116-0, 116-1, 116-2, 116-3, 116-4, 116-5, 116-6 and 116-7 are provided. Each multiplexer 116-0 to 116-7 corresponds to a different activate-able column line pair of each set of column line pairs c0–c7 controlled by the column address decoder 114. In the column decoder architecture 100 shown in FIG. 3, the column address decoder 114 only controls a single set of column line pairs c0–c7 and thus there is a one-to-one correspondence between multiplexers 116-0 to 116-7 and column line pairs c0–c7. As such, the multiplexer 116-0 corresponds to the $0^{th}$ column c0 of the set. The multiplexer 116-1 corresponds to the $1^{st}$ column c1 of the set. The multiplexer 116-2 corresponds to the $2^{nd}$ column c2 of the set. The multiplexer 116-3 corresponds to the $3^{rd}$ column c3 of the set. The multiplexer 116-4 corresponds to the $4^{th}$ column c4 of the set. The multiplexer 116-5 corresponds to the $5^{th}$ column c5 of the set. The multiplexer 116-6 corresponds to the $6^{th}$ column c6 of the set. The multiplexer 116-7 corresponds to the $7^{th}$ column c7 of the set. Each multiplexer 116-0 to 116-7 has an input connected to the pair of data lines 122. Each multiplexer 116-0 to 116-7 also receives a different select line at its select input, namely, the select line corresponding to the same column line pair of each set as the multiplexer. That is, the multiplexer 116-0 receives the select line s0 at its select input. The multiplexer 116-1 receives the select line s1 at its select input. The multiplexer 116-2 receives the select line s2 at its select input. The multiplexer 116-3 receives the select line s3 at its select input. The multiplexer 116-4 receives the select line s4 at its select input. The multiplexer 116-5 receives the select line s5 at its select input. The multiplexer 116-6 receives the select line s6 at its select input. The multiplexer 116-7 receives the select line s7 at its select input.

Figure 1:
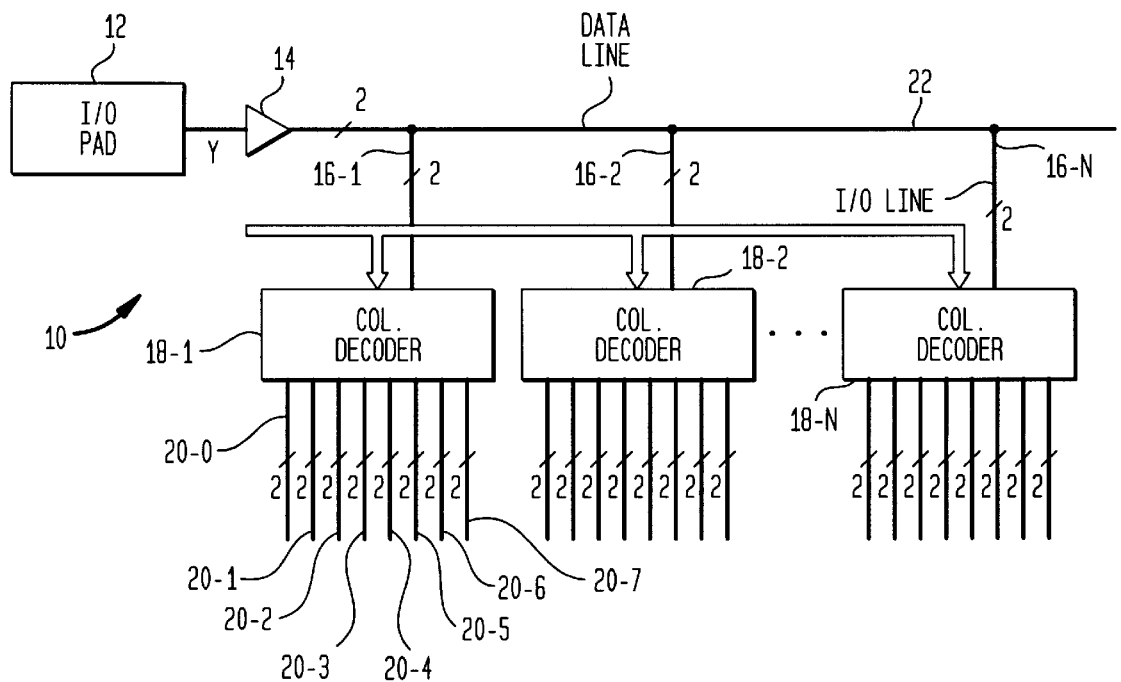
FIG. 1 shows a first conventional column decoder architecture.
Figure 2:
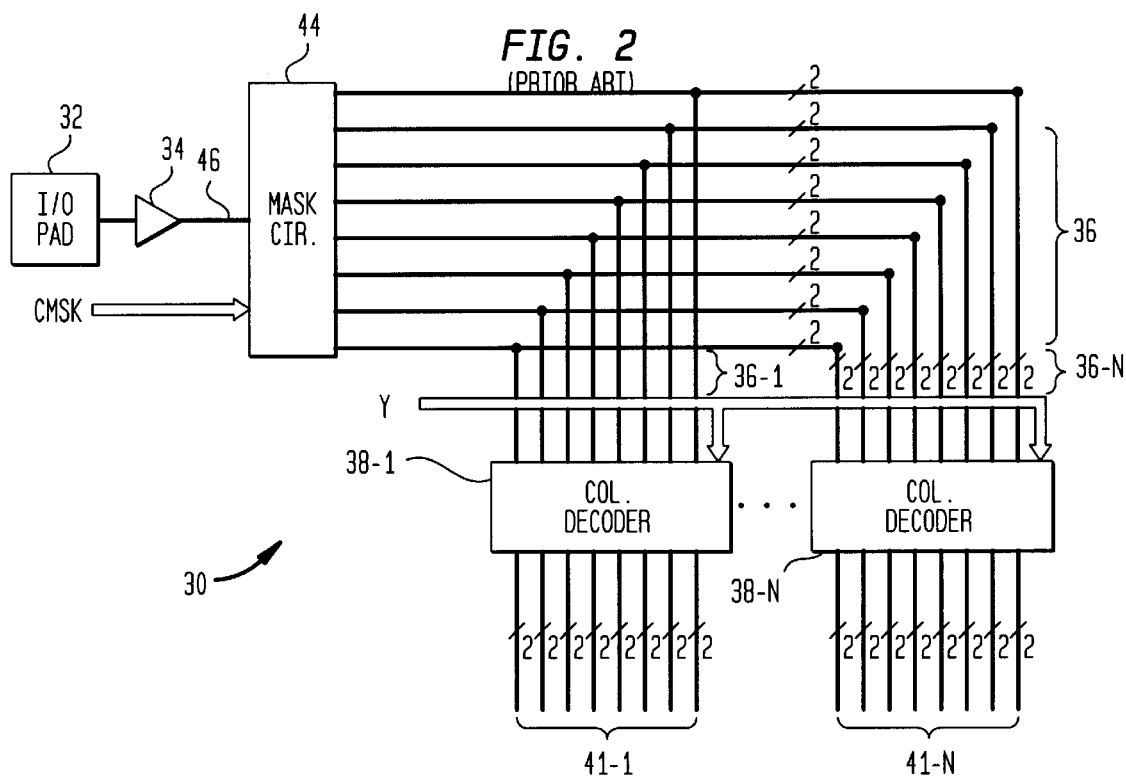
FIG. 2 shows a second conventional column decoder architecture.

Each multiplexer 116-0 to 116-7 is connected to a different pair of fractional I/O lines 140–147. The multiplexer 116-0 is connected to the pair of fractional I/O lines 140. The multiplexer 116-1 is connected to the pair of fractional I/O lines 141. The multiplexer 116-2 is connected to the pair of fractional I/O lines 142. The multiplexer 116-3 is connected to the pair of fractional I/O lines 143. The multiplexer 116-4 is connected to the pair of fractional I/O lines 144. The multiplexer 116-5 is connected to the pair of fractional I/O lines 145. The multiplexer 116-6 is connected to the pair of fractional I/O lines 146. The multiplexer 116-7 is connected to the pair of fractional I/O lines 147. The fractional I/O line pairs 140–147 are so called because they can be divided into (pair-wise) collinear groups. That is, the fractional I/O line pairs 141, 142, 145 and 146 are mutually collinear, as if formed by dividing a single parallel pair of I/O lines along their length into four discontinuous segments 141, 142, 145 and 146. Likewise, the fractional I/O line pairs 140, 143, 144 and 147 are mutually collinear, as if formed by dividing a single pair of parallel I/O lines along their length into four discontinuous segments 140, 143, 144 and 147. Because of the collinear property of the fractional I/O lines 140–147, the spacing requirement at the top of the array is reduced. Specifically, in the example shown in FIG. 3, eight fractional I/O line pairs 140–147 can be laid out in the spacing requirement (i.e., in the width direction) of two I/O line pairs. Note also that each pair of fractional I/O lines 140, 141, 142, 143, 144, 145, 146 and 147 is much shorter than the length of the array. In fact, each pair of fractional I/O lines 140–147 is only a fraction of the length of the column decoder 100 containing the pair of fractional I/O lines 140–147. As such, the RC (resistive-capacitive) propagation delay of each I/O fractional line pair 140–147 is relatively short in comparison to the RC propagation delay of the I/O lines 36 of FIG. 2.

Figure 4:
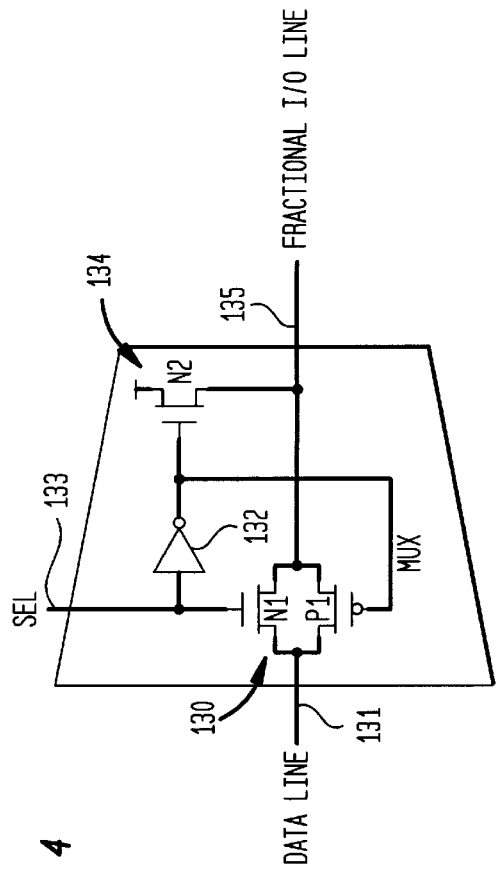
FIG. 4 shows a multiplexer according to an embodiment of the present invention.

FIG. 4 shows a portion of each multiplexer 116-0 to 116-7. That is, two copies of each circuit 130, 132 and 134, namely, one for each data in line 131 of the pair of data in lines 122, are preferably provided. Each data in line 131 of the pair of data in lines 122 is connected to an input of a different pass gate 130, formed by an NMOSFET N1 and a PMOSFET P1. The data in line 131 is connected to the sources of P1 and N1 and the drains of P1 and N1 are connected to a respective fractional I/0 line 135 of the corresponding pair of fractional I/O lines. The corresponding select line 133 is connected to the gate of (each copy of the NMOSFET) N1 and to (each copy of) an inverter 132. The complementary output of (each copy of) inverter 132 is connected to the gate of (a respective copy of) P1. A weak pull-up driver 134 is provided including an NMOSFET N2 which has its drain connected to the fractional output line 135, its source connected to the high voltage power supply bus and its gate connected to the output of the inverter 132. Alternatively, the pull-up driver 134 can be formed using a PMOSFET having its gate connected directly to the select line 133. When not enabled by a logic '1' signal of the select line 133, each copy of the weak pull-up driver 134 pulls up the voltage level of the fractional I/O line 133 (to which it is connected) to a high voltage. With both fractional I/O lines 135 at a high voltage, the column line pair to which the fractional I/O lines are connected is deactivated. The deactivated column line pairs c0–c7 do not change the data value in any cells connected thereto and do not read out any value from the cells connected thereto.

During a maskable block write operation, the externally supplied mask signal CMSK is inputted to the column decoder 114. In response, the column decoder 114 outputs a high voltage level on each select line s0–s7 of each column signal of each set selected by the mask signal CMSK. As a result, the data value on the data in line pair 122 is outputted from each of the multiplexers 116-0 to 116-7 that receives a corresponding high voltage level on a corresponding select line s0–s7, onto the respective fractional I/O line pair 140, 141, 142, 143, 144, 145, 146 or 147. The column line pairs c0–c7, connected to the respective fractional I/O lines pairs 140, 141, 142, 143, 144, 145, 146, and/or 147 on which the data value is outputted, are activated and receive the data value for storage in accessed memory cells connected thereto. Each of the multiplexers 116-0 to 116-7 receiving a low voltage select signal s0–s7 outputs a high voltage level on both fractional I/O lines of the pair of fractional I/O lines 140, 141, 142, 143, 144, 145, 146 or 147 connected thereto. The column line pairs connected to these fractional I/O line pairs on which a high voltage is outputted are deactivated and do not store any values in the cells connected thereto.

For example, suppose the mask signal CMSK='1011 1011' (in left to right order from most significant column to least significant column of each column set). In this situation, a high voltage level would be outputted on select lines s7, s5, s4, s3, s1 and s0 and a low voltage would be outputted on select lines s6 and s2. As such, only multiplexers 116-7, 116-5, 116-4, 116-3, 116-1 and 116-0 output the data value on fractional output line pairs 147, 145, 144, 143, 141 and 140. Hence, only columns c0, c1, c3, c4, c5 and c7 are activated and would store the data value in accessed memory cells connected thereto.

Figure 5:
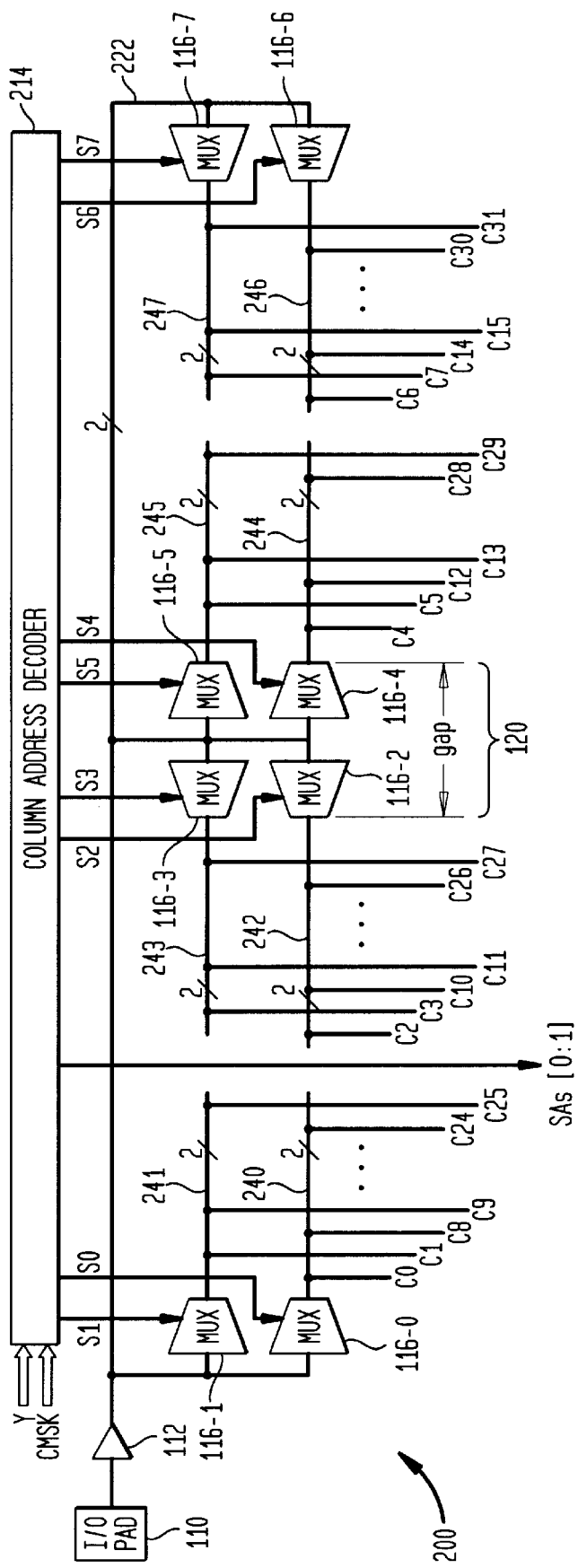
FIG. 5 shows a column decoder architecture according to another embodiment of the present invention.

Note that the multiplexers 116-2 to 116-5 are positioned within the gap 120. Illustratively, the gap 120 can be small, e.g., about 10 μm, in a fabrication process with a photolithographic resolution of 0.35 μm. Moreover, the number of gaps is the same regardless of the pitch of the column decoder. For instance, a quad pitch column decoder architecture is illustrated in FIG. 5. As before, eight pairs of fractional I/O lines 240–247 are provided including one pair of fractional I/O lines 240–247 per selectable column of each set, where fractional I/O line pairs 240, 242, 244 and 246 form a first group of pair-wise collinear fractional I/O lines and where fractional I/O lines 241, 243, 245 and 247 form a second group of pair-wise collinear fractional I/O lines. Four column line pairs are connected to each pair of fractional I/O lines 240–247, namely, the corresponding column line pair of each of the four respective sets to which the column address decoder 214 control access. Thus, column line pairs c0, c8, c16 and c24 are connected to the fractional I/O line pairs 240 corresponding to the $0^{th}$ column of each set. Column line pairs c1, c9, c17 and c25 are connected to the fractional I/O line pairs 241 corresponding to the $1^{st}$ column of each set. Column line pairs c2, c10, c18 and c26 are connected to the fractional I/O line pairs 242 corresponding to the $2^{nd}$ column of each set. Column line pairs c3, c11, c19 and c27 are connected to the fractional I/O line pairs 243 corresponding to the $3^{rd}$ column of each set. Column line pairs c4, c12, c20 and c28 are connected to the fractional I/O line pairs 244 corresponding to the $4^{th}$ column of each set. Column line pairs c5, c13, c21 and c29 are connected to the fractional I/O line pairs 245 corresponding to the $5^{th}$ column of each set. Column line pairs c6, c14, c22 and c30 are connected to the fractional I/O line pairs 246 corresponding to the $6^{th}$ column of each set. Column line pairs c7, c1 , c23 and c31 are connected to the fractional I/O line pairs 247 corresponding to the $7^{th}$ column of each set. In addition to decoding the column address Y into select signals s0–s7, the column address decoder 214 also decodes respective bits of the column address Y to produce sense amplifier select signals SAs[0:1]. The sense amplifier select signals SAs[0:1] are received at respective sense amplifiers connected to the column line pairs c0–c31 (not shown). During a normal read or write operation, the sense amplifier select signals SAs[0:1] selectively enable or disable the sense amplifiers, thereby effectively activating only a single column line pair.

During a block write operation, the data value on data in line pair 122 is selectively outputted by multiplexers 116-0 to 116-7 on only those fractional I/O line pairs 240–247 as indicated by the mask signal CMSK. As such, the column line pairs of each set c0–c7, c8–c15, c16–c23 and c24–c31 connected to a fractional I/O line pair 240–247 on which the data value is outputted are activated and store the data value in memory cells connected thereto.

The above discussion is intended to be merely illustrative of the invention. Those having ordinary skill in the art may devise numerous alternative embodiments without departing from the spirit and scope of the following claims.

The claimed invention is:

1. A semiconductor memory column decoder comprising:
   first and second groups of parallel column lines, said first and second groups being separated from each other by a gap,
   one or more groups of fractional I/O lines, each fractional I/O line being collinear with each other fractional I/O line of the same group, one fractional I/O line being provided for, and being connected to, each column line of said first and second groups of column lines, and
   a plurality of multiplexers, including one multiplexer corresponding to each fractional I/O line, each multiplexer having an input connected to a single data line, a select input connected to a corresponding column select line, and an output connected to said corresponding fractional I/O line, at least some of said multiplexers being positioned in said gap.

2. The semiconductor memory column decoder of claim 1 wherein each multiplexer comprises:

an inverter having an input connected to said column select line and an output connected to an inverted column select line, a pass gate having said data line connected to an input thereof, said corresponding fractional I/O line being connected to an output thereof, and said column select line and said inverted column select line being connected to control and inverted control inputs, respectively, thereof, and a driver having an enabling input connected to at least one of said column select line and said inverted column select line and an output connected to said corresponding fractional I/O line, said driver being enabled when said pass-gate is disabled to drive said corresponding fractional I/O line to a particular voltage level so as to deactivate said corresponding fractional I/O line, and column line to which it is connected.

3. The semiconductor memory column decoder of claim 1 further comprising:

third and fourth groups of column lines divided by said gap, wherein said first and second groups of column lines form a first set of column lines, wherein said third and fourth groups of column lines form a second set of column lines, wherein each column line of said first and second sets corresponds to, and is connected to, a different column of cells of a memory array, and wherein each of said fractional I/O lines is connected to one column line of said first set and one column line of said second set.

4. The semiconductor memory column decoder of claim 1 wherein said column lines are divided into plural sets of column lines and wherein each of said first and second groups of column lines comprises one or more column lines of each of said sets, each set of column lines being separately enabled or disabled during an ordinary read or write operation.

5. The semiconductor memory of claim 1 wherein each group of fractional I/O lines comprises plural pairs of parallel fractional I/O lines, which fractional I/O lines are pair-wise collinear with each other pair of fractional I/O lines of the same group.

6. The semiconductor memory of claim 1 wherein said first and second groups of column lines comprises first and second groups of pairs of column lines, each pair of column lines corresponding to, and being connected to, a respective column of memory cells of a memory array.

* * * * *